United States Patent
Twardowski

[19]

[11] Patent Number: 6,043,765
[45] Date of Patent: Mar. 28, 2000

[54] METHOD AND APPARATUS FOR PERFORMING A PARALLEL SPECULATIVE HUFFMAN DECODING USING BOTH PARTIAL AND FULL DECODERS

[75] Inventor: Kirk Twardowski, San Jose, Calif.

[73] Assignee: Silicon Engineering, Inc., Scotts Valley, Calif.

[21] Appl. No.: 08/937,751

[22] Filed: Sep. 26, 1997

[51] Int. Cl.[7] .................................................. H03M 7/40

[52] U.S. Cl. ................................................. 341/65; 341/67

[58] Field of Search ..................... 341/65, 67; 382/233; 395/388; 711/137, 207; 712/206; 714/759

[56] References Cited

U.S. PATENT DOCUMENTS

| | | | |
|---|---|---|---|
| 5,630,083 | 5/1997 | Carbine et al. | 395/388 |
| 5,675,332 | 10/1997 | Limberg | 341/67 |
| 5,680,482 | 10/1997 | Liu et al. | 382/233 |

*Primary Examiner*—Michael Tokar
*Assistant Examiner*—Patrick Wamsley
*Attorney, Agent, or Firm*—Blakely, Sokoloff, Taylor & Zafman LLP

[57] ABSTRACT

A parallel speculative decoder is described. The decoder includes a set of partial decoders and an additional decoder. The partial decoders are aligned at different positions of a portion of an input data stream and speculatively and simultaneously decode symbols (e.g., codewords) having less bits than a longest symbol length. The additional decoder decodes symbols in the event the first partial decoder does not produce valid decoding results.

18 Claims, 2 Drawing Sheets

METHOD AND APPARATUS FOR PERFORMING A PARALLEL SPECULATIVE HUFFMAN DECODING USING BOTH PARTIAL AND FULL DECODERS

FIELD OF THE INVENTION

The present invention relates to the field of decoding; more particularly, the present invention relates to a Huffman decoder that uses multiple partial decoders in parallel to decode multiple symbols (e.g., codewords) in a single cycle.

BACKGROUND OF THE INVENTION

Data compression is an extremely useful tool for storing and transmitting large amounts of data. Huffman coding is a well-known technique for encoding information with as few bits as possible. Reducing the number of bits is a critical part of any system that requires compression of the information in order to conserve resources (memory, bandwidth, etc.), particularly with systems that process image data such as computer graphics and digital video. For example, the bandwidth required to transmit an image is reduced drastically when compression is used to decrease the number of bits required to recreate the image.

In Huffman coding, each possible input symbol is mapped to a variable length codeword. The length of each codeword is inversely related to the probability of occurrence of the associated symbol it represents. Thus, a frequently occurring input symbol is represented by a codeword with only a few bits while an input symbol that occurs infrequently is represented by a codeword consisting of many more bits.

Huffman coding is often used in conjunction with other algorithms such as the Discrete Cosine Transform (DCT) or wavelet transforms. Huffman coding is very effective for compressing image information. In fact, Huffman coding is part of the Joint Picture Experts Group (JPEG) standard and the Motion Picture Experts Group (MPEG) standard.

The variable length codewords in the Huffman code limit decoding throughput. Since all of the codewords are of variable length, it is impossible to identify the boundaries between individual codewords prior to decoding. Thus, codewords cannot be decoded independently of one another since each codeword is recursively related to all of the preceding codewords. Instead, to decode codeword N, it is necessary to decode the proceeding 1 through N–1 codewords before N can be located and subsequently decoded.

Designing a very large scale integrated circuit (VLSI) based Huffman decoder requires that circuit size and speed also be considered. A straight forward solution that can process one codeword per cycle consists primarily of two components: a decoder capable of handling all possible codewords and a shifter that can shift as many bits as the largest codeword. Input data is presented to this circuit in parallel and is at least as wide as the largest codeword. In every cycle, the decoder determines the current codeword and the shifter shifts that codeword out. This solution is guaranteed to be able to process 1 codeword per cycle. The problem is that, given the size of the decoder and the shifter, performing the decode and shift in a single cycle becomes the critical timing path and limits clock speed. Another drawback is that a significant portion of the hardware in this solution is used very infrequently since most of the codewords occur very infrequently.

One prior art software decoder included a small lookup table (LUT) followed by a larger LUT. As codewords are received, the small LUT is used to decode codewords if possible. However, all codewords that cannot be decoded using the smaller decoder are decoded by the larger LUT.

Thus, what is needed is a way to decode more than one codeword per cycle while removing the decode from the critical path so as to not impede clock speed.

SUMMARY OF THE INVENTION

A parallel speculative decoder is described. The decoder includes a set of partial decoders and an additional decoder. The partial decoders are aligned at different positions of a portion of an input data stream to speculatively and simultaneously decode symbols (e.g., codewords) having less bits than a longest symbol length. The additional decoder decodes symbols in the event the first partial decoder does not produce valid decoding results.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A parallel speculative decoder is described. In the following description, numerous details are set forth, such as types of codes, numbers of bits, etc. It will be apparent, however, to one skilled in the art, that the present invention may be practiced without these specific details. In other instances, well-known structures and devices are shown in block diagram form, rather than in detail, in order to avoid obscuring the present invention.

Overview of the Present Invention

The present invention provides a decoder that includes multiple partial decoders to perform speculative decodes in parallel across a current input data stream of symbols. In one embodiment, the symbols comprise codewords. The present invention relies on the fact that most codewords are used very infrequently, and the length of the most frequently occurring codewords is very short. The present invention aligns the partial decoders at different positions of the input data stream. The partial decoders decode the bits they receive. If the first partial decoder decodes a valid codeword, it signals the next partial decoder to indicate that it is decoding a valid codeword. This continues through the remaining set of partial decoders. A full decoder is used to decode codewords where the first partial decoder doesn't decode a valid codeword.

In one embodiment, the partial decoders perform Huffman decoding where the symbols comprise Huffman codewords. The input data is received by the partial decoders in a bit-parallel fashion. Each partial decoder decodes N bits at a time where N is less than the longest codeword.

The present invention is advantageous in that it breaks the recursive bottleneck described above and allows multiple codewords to be decoded simultaneously. Decoding multiple codewords in parallel allows the hardware to be repartitioned across multiple cycles, enabling the use of a faster cycle time. Numerous configurations are possible which allow design tradeoffs between circuit size, clock speed, and the number codewords generated per cycle.

Figure 1:
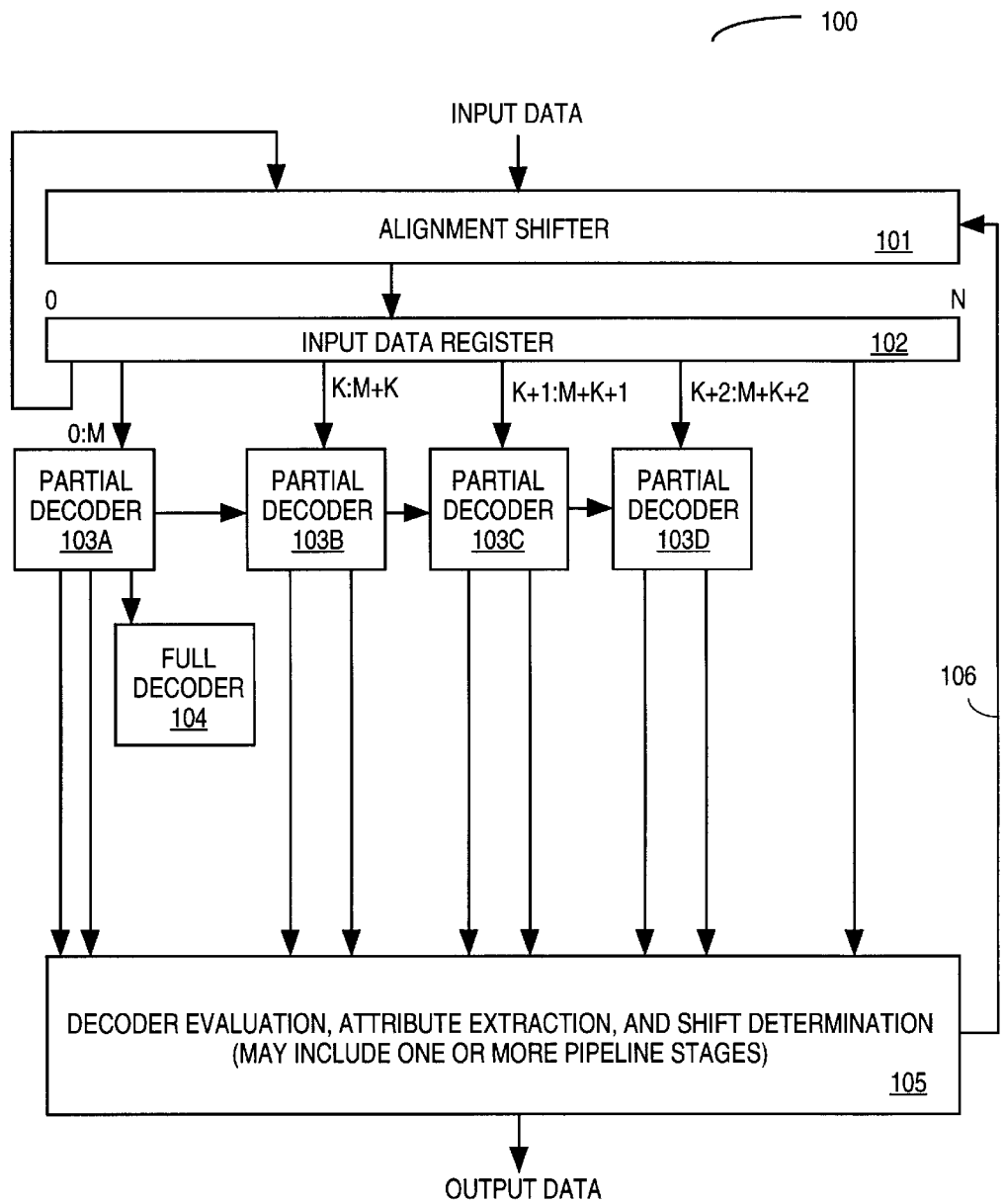
FIG. 1 is a block diagram of one embodiment of a Huffman decoder.

FIG. 1 illustrates a block diagram of one embodiment of the Huffman decoder of the present invention. Referring to FIG. 1, Huffman decoder 100 comprises an alignment shifter 101, an input data register 102 coupled to alignment shifter 101, partial decoders 103a–d coupled to input data register 102, a full decoder 104 coupled to input data register 102 as well, and a decoder output block 105 coupled to receive outputs of partial decoders 103a–d and full decoder 104.

Alignment shifter 101 shifts input data into input register 102 and, as codewords are consumed, shifts codewords in input data register 102 to re-align them with partial decoders 103a–d as well as adjoin incoming data with the data already stored therein. Input data register 102 holds data for partial decoders 103a–d and full decoder 104.

Partial decoders 103a–d are coupled to the starting position of every possible codeword for a fixed number of bits in input data register 102. In one embodiment, four partial decoders are included. However, any number of partial decoders may be used (e.g., 1, 2, 3, 5, etc.). Partial decoder 103a is coupled to receive and decode bits 0 to M of input data register 102. Partial decoder 103b is coupled to receive and decode bits K to M+K. Partial decoder 103c is coupled to receive and decode bits K+1 to M+K+1, and partial decoder 103d is coupled to receive and decode bits K+2 to M+K+2.

Each of the partial decoders 103c–d decode a predetermined number of bits. However, the predetermined number of bits is less than the maximum codeword length. In one embodiment, each partial decoder is only capable of decoding some, not all, of the possible codewords, which a full decoder is capable of decoding. In this case, the codewords that a partial decoder is able to decode are the most frequently used codewords. In one embodiment, each partial decoder is implemented as a lookup table. This lookup table is only a subset of a full lookup table used for Huffman coding by the full decoder 154. A very simple huffman code is given in Table 1.

TABLE 1

| Symbol | Codeword |
|--------|----------|
| A | 0 |
| B | 10 |
| C | 1101 |
| D | 1110 |
| E | 1111 |

Each of partial decoders 103a–d starts at a different bit position on input data stream register 102 and the arrangement is such that regardless of the length of the codewords, there will be a partial decoder at the start of each codeword within the range of bits covered by the decoders. In other words, partial decoders 103b and 103c overlap each other. The present invention performs many decodes in parallel covering every possible starting bit position for a codeword and then determines which of the decodes is valid, i.e., had a start bit position that coincided with the start of a codeword. With this approach, it is possible to have several valid codewords decoded in a cycle; in fact, this is very likely given an appropriate choice for the size of the partial decoders and the number of decoders with respect to the set of all codewords.

In one embodiment, the outputs of each decoder includes a length field and validity (e.g., bit(s)) flag in addition to any other attributes that might be associated with each symbol (such as zero run length or mantissa length). The length field indicates the length of the codeword decoded. The validity flag indicates that the decoder has decoded a valid codeword. In other words, the valid flag indicates the outputs of the decoder are valid.

A decoder determines that its outputs are valid by comparing its starting bit position with the sum of the codeword lengths from the preceding decoders which have marked their output as valid. If the result of the comparison indicates that the decoder is aligned with the start of a codeword, then it flags its output as valid. The first partial decoder 103a is always guaranteed to be correctly aligned with a codeword since the input data is shifted until a codeword start is aligned with the first partial decoder 103a. Since partial decoders 103a–d are very small and therefore very fast, it is possible to use many of them and still obtain validity information for all the partial decoders in a reasonable time even though the length information ripples through all of the partial decoders.

When a codeword is detected that is longer than can be handled by the partial decoders 103a–d, the current partial decoder and all subsequent partial decoders are marked as invalid. In conjunction with the first partial decoder, full decoder 104 processes those codes not handled by partial decoders 103a–d. Since decoder 104 covers the entire table, it is relatively large. In one embodiment, there is only one copy of the entire table in decoder 100 and it operates only on the first codeword in input data register 102. When a large codeword is detected, subsequent decoding is halted, and that codeword is shifted to the beginning of input data register 102 so that it can be handled by full decoder 104. Since codewords of this length occur infrequently, average throughput is not decreased significantly by the delay needed to handle them.

In one embodiment, output block 105 comprises a multistage block of logic that determines which decoders are sourcing valid symbols and selects that data to be passed to the output. Output block 105 also calculates the number of bits consumed for the current decode pass and uses that to control the size of the shift in alignment shifter 101. Output block 105 controls alignment shifter 101 via signal 106. In one embodiment, signal 106 may comprise one or more conductors. Also output block 105 may comprise one or more pipeline stages.

In one embodiment, output block 105 extracts any attribute data that might be embedded with each codeword in the input data stream. Thus, output block 105 optionally performs decoder evaluation, attribute extraction, and shift determination.

Using a partial decoder requires significantly fewer gates to implement than the full decoder, which makes it practical to replicate partial decoders. Also using a partial decoder results in a very small circuit delay through decoder 100. On the average, since most of the codewords are small, the partial decoder can easily cover 80 to 90 percent of all codewords processed.

Since multiple codewords can, on the average, be obtained simultaneously the recursive constraint of decoding a codeword and then shifting the input data to align the next codeword with the decoder can be relaxed across multiple cycles. For example, if an average of 2 codes can be decoded simultaneously, then 2 cycles could be used to perform the decode and shift operations and the performance would be equivalent to the design that uses a full decoder and shifter. By adjusting the size and quantity of partial decoders, it is possible select a particular number of codes which can be decoded simultaneously. This can then be used to either partition the design across as desired number of cycles or to increase the decoding throughput or a combination of both. Also, partitioning the design across multiple cycles can permit the use of a faster clock which also results in faster throughput.

Figure 2:
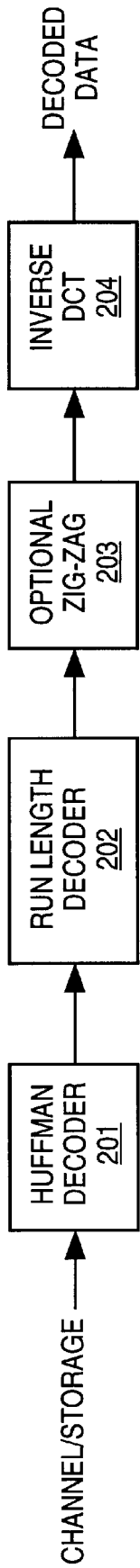
FIG. 2 is a block diagram of one embodiment of a decompression system including the Huffman decoder of the present invention.

FIG. 2 illustrates a block diagram of one embodiment of the decompressor of the present invention. Referring to FIG. 2, the decompressor includes Huffman decoder 201, which may comprise the decoder described above in conjunction with FIG. 1. Huffman decoder 201 performs Huffman decoding. The output of Huffman decoder 201 comprises run lengths, which are decoded by run length decoding block 202. The decoded run lengths are coupled to the input of zigzag ordering block 203, which performs well-known reverse zig-zag ordering techniques. The output of zig-zag ordering block 203 comprises transformed values, which are inverse transformed by inverse transform block 204. The output of inverse transform block 204 is the decoded data.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the various embodiments are not intended to limit the scope of the claims which in themselves recite only those features regarded as essential to the invention.

Thus, a decoder has been described.

We claim:

1. A decoder comprising:
   a set of partial decoders aligned at different positions of a portion of an input data stream having a plurality of symbols to speculatively and simultaneously decode codewords in the input data stream having fewer bits than a longest codeword length, where the different positions comprise every possible starting bit position for a codeword with a range of bits; and
   an additional decoder coupled to decode codewords when at least a first of the set of partial decoders does not decode a valid codeword.

2. The decoder defined in claim 1 wherein the decoder further comprises a register coupled to provide bits of the input data stream to the plurality of a partial decoders.

3. The decoder defined in claim 1 wherein each of the plurality of partial decoders comprises a look-up table.

4. The decoder defined in claim 1 wherein each partial decoder provides a validity indication corresponding to results of decoding its portion of the input data stream.

5. The decoder defined in claim 1 wherein each partial decoder compares its starting position with a sum of the codeword lengths from preceding decoders having valid decoding results to determine if it is aligned with a start of a codeword.

6. The decoder defined in claim 1 wherein a partial decoder generates an indication that its outputs is valid when aligned with a start of a codeword.

7. The decoder defined in claim 1 wherein the additional decoder comprises a full decoder.

8. The decoder defined in claim 1 wherein each of the partial decoders in the set are identical.

9. The decoder defined in claim 1 wherein each codeword comprises a Huffman codeword.

10. A decompression system comprising:
    a Huffman decoder comprising
    a set of partial decoders aligned at different positions of a portion of an input data stream having a plurality of codewords to speculatively and simultaneously decode codewords in the input data stream having fewer bits than a longest codeword length, where the different positions comprise every possible starting bit position for a codeword with a range of bits; and
    an additional decoder coupled to decode codewords when at least a first of the set of partial decoders does not decode a valid codeword;
    a run-length decoder coupled to the Huffman decoder;
    a zig-zag ordering mechanism coupled to the run-length decoder; and
    an inverse DCT coupled to the zig-zag ordering mechanism.

11. The system defined in claim 10 wherein the system further comprises a register coupled to provide bits of the input data stream to the plurality of a partial decoders.

12. The system defined in claim 10 wherein each of the plurality of partial decoders comprises a look-up table.

13. The system defined in claim 10 wherein each partial decoder provides a validity indication corresponding to results of decoding its portion of the input data stream.

14. The system defined in claim 10 wherein each partial decoder compares its starting position with a sum of the codeword lengths from preceding decoders having valid decoding results to determine if it is aligned with a start of a codeword.

15. The system defined in claim 10 wherein a partial decoder generates an indication that its outputs is valid when aligned with a start of a codeword.

16. The system defined in claim 10 wherein the additional decoder comprises a full decoder.

17. The system defined in claim 10 wherein each of the partial decoders in the set are identical.

18. The system defined in claim 10 wherein each codeword comprises a Huffman codeword.

* * * * *